United States Patent [19]

Kunugi

[11] 4,415,862
[45] Nov. 15, 1983

[54] PULSE WIDTH MODULATION AMPLIFIER

[75] Inventor: Yoshiro Kunugi, Saitama, Japan

[73] Assignee: Pioneer Electronic Corporation, Tokyo, Japan

[21] Appl. No.: 247,036

[22] Filed: Mar. 24, 1981

[30] Foreign Application Priority Data

Mar. 28, 1980 [JP] Japan .................................. 55-39023

[51] Int. Cl.³ ............................................. H03F 3/38
[52] U.S. Cl. .................................. 330/10; 330/124 R
[58] Field of Search ...................... 330/10, 207 A, 251, 330/295, 124 R

[56] References Cited

U.S. PATENT DOCUMENTS

| | | | |
|---|---|---|---|
| 3,336,538 | 8/1967 | Crowhurst | 330/207 A |
| 4,162,455 | 7/1979 | Birt | 330/10 |
| 4,164,714 | 8/1979 | Swanson | 330/10 |

OTHER PUBLICATIONS

"Amplificateur Audio 100 W Classe D'A VMOS" *EAI*, Jun. 15, 1979, pp. 54, 55.

*Primary Examiner*—James B. Mullins
*Attorney, Agent, or Firm*—Sughrue, Mion, Zinn, Macpeak, and Seas

[57] ABSTRACT

A pulse width modulation amplifier in which interchannel distortion is eliminated by making the pulse transition times different between different ones of the channels. Ramp carrier signals having different phases are applied to respective pulse width modulation comparators of the two channels. The ramp carrier signals are generated by applying the output of an oscillator directly to one of the pulse width modulation comparators while the other is generated through a phase delay circuit which provides constant phase relationship independent of the frequency of the output of the oscillator. The output of the oscillator is coupled to one input of a comparator which produces first and second output signals one of which is in a high state depending upon the relative potentials of the two inputs to the comparator. The outputs are coupled to respective constant current sources which charge and discharge a capacitor in accordance with the output state of the comparator. The output voltage from the capacitor is coupled through an integrator circuit to the second of the input terminals of the comparator.

3 Claims, 7 Drawing Figures

FIG. 1 PRIOR ART
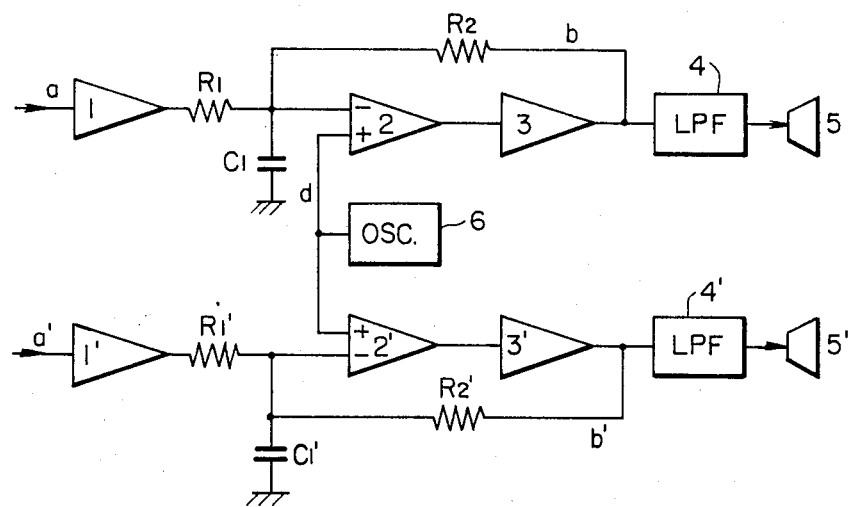
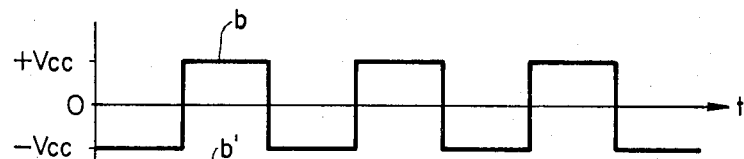
FIG. 2a
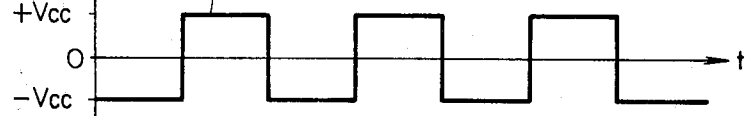
FIG. 2b
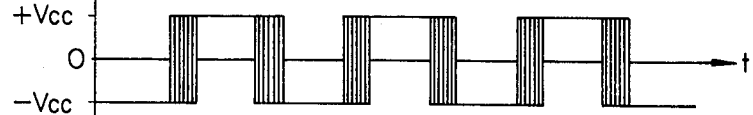
FIG. 2c
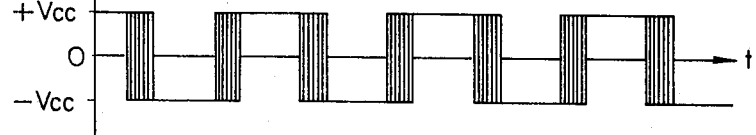
FIG. 2d

PULSE WIDTH MODULATION AMPLIFIER

BACKGROUND OF THE INVENTION

The present invention relates to a pulse width modulation amplifier for a plurality of channels.

A pulse width modulation amplifier is used to modulate a low frequency signal such as an audio signal with a high frequency carrier signal to convert it into a pulse width modulated signal, amplify the pulse width modulated signal and demodulate it by removing the carrier signal before the signal is applied to a load such as loudspeaker. Such an amplifier can amplify a signal very efficiently and thus it is considered very effective for use in automobile mounted audio equipment.

In such an amplifier designed for two channels, the right channel is composed, as shown in FIG. 1, of an audio amplifier 1, a comparator 2, a pulse amplifier (power amplifier) 3, a low-pass filter 4 and the loudspeaker 5. An output of the pulse amplifier 3 is fed back through resistors $R_1$, $R_2$ and a capacitor $C_1$ to the comparator 2. The left channel is composed similarly of an audio amplifier, a comparator 2', a pulse width amplifier 3', a low-pass filter 4' and a loudspeaker 5'. An output of the pulse amplifier 3' is fed back through resistors $R_1'$, $R_2'$ and a capacitor $C_1'$ to the comparator 2'. A ramp wave carrier signal d produced by a single oscillator 6 is applied to non-inverting terminals of the comparators 2 and 2' which are used to perform the pulse width modulation of the audio signal. The application of the ramp carrier signal d from the common oscillator 6 to both channels is advantageous in view of the elimination thereby of any beat problems and the reduced cost.

It is to be noted that the circuit of FIG. 1 is not being described herein as prior art and this circuit is discussed herein for the purpose of attaining a full understanding of the present invention. The circuit of FIG. 1 is described in more detail in U.S. Pat. application Ser. No. 247,033 filed Mar. 24, 1981.

In this circuit, when input audio signals a and a' are both zero, rectangular pulse outputs b and b' of the pulse amplifiers 3 and 3' are in phase as shown by FIGS. 2a and 2b, respectively, and thus the rise and fall times of the two signals are coincident. On the other hand, when the audio signals a and a' reach a predetermined level, the pulse outputs of the pulse amplifiers 3 and 3' are modualted and the duty cycles thereof varied in accordance with the input audio signals as shown in FIG. 2c. However, if the waveforms of these channels are coincident due to variations of the duty cycles, the comparators 2 and 2' may affect each other and thereby produce inter-channel distortion.

SUMMARY OF THE INVENTION

In view of the above-noted drawbacks, in accordance with the present invention, a phase difference is introduced between the carrier signal applied from the oscillator to one of the channels and the carrier signal applied from the same oscillator to the other channel. These carrier signals are applied to the comparators in each of the channels.

Somewhat more specifically, the invention provides a pulse width modulation amplifier for a plurality of channels including first and second channel amplifiers each of which includes a pulse width modulation comparator and means for applying ramp carrier signals having different phases to respective ones of the pulse width modulation comparators. With this circuit, the rise and fall times of output rectangular pulses of the comparators are made to occur at different times between the first and second channels so that interchannel distortion is thereby eliminated.

BRIEF DESCRIPTION OF THE DRAWINGS

FIG. 1 is a block circuit diagram of a conventional pulse width modulation amplifier for two-channel application;

FIG. 2a–2d show signal waveforms for an explanation of pulse width modulation;

DESCRIPTION OF THE PREFERRED EMBODIMENTS

Figure 3:
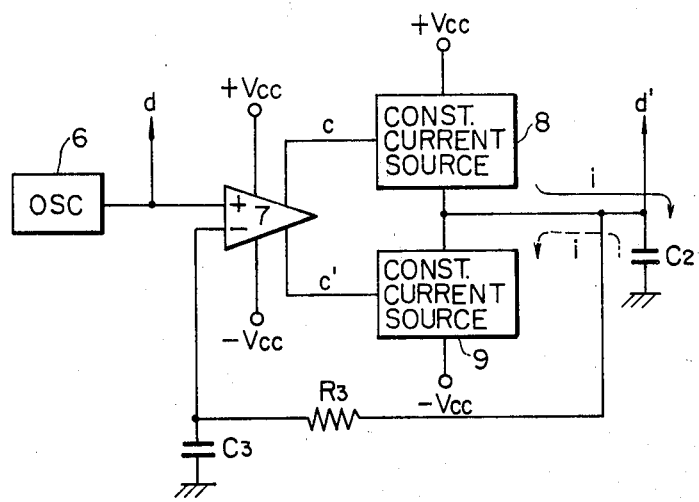
FIG. 3 is a circuit diagram of a carrier signal generator in a preferred embodiment of the invention.
Figure 4:
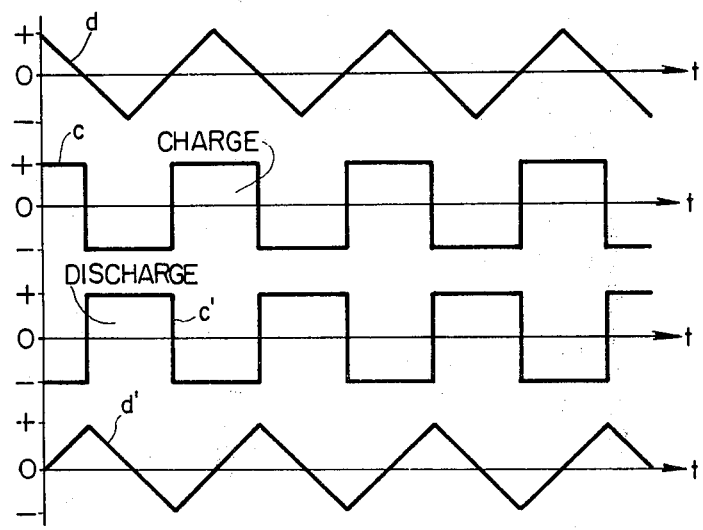
FIG. 4 shows signal waveforms at various points in the circuit of FIG. 3.

A preferred embodiment of a pulse width modulator amplifier according to the present invention will be described with reference to FIGS. 3 and 4. FIG. 3 is a circuit diagram of a circuit of the invention for converting the carrier signal d from the oscillator 6 of FIG. 1 into a signal d' having a phase shifted by $\pi/2$ from that of the signal d. A comparator 7 whose non-inverting input terminal is supplied with a ramp signal d from the oscillator 6 provides one of a normal phase output C and reverse phase output C', selectively, to selectively activate one of constant current sources 8 and 9 which are connected between power sources +Vcc and −Vcc. The selected constant current is used to charge or discharge a capacitor $C_2$ connected between a junction of the power sources 8 and 9 and ground. An output signal d' of the capacitor $C_2$ is integrated by an integrator circuit composed of a resistor $R_3$ and a capacitor $C_3$ and fed back to the non-inverting input terminal of the comparator 7 to provide negative feedback.

The ramp carrier signal d from the oscillator 6 is symmetrical with respect to the zero level and has positive and negative peaks of the same amplitude. When the signal d changes from negative polarity to positive polarity, the selected output from the comparator 7 is changed at the zero voltage level so that the normal phase output C is outputted as a high level signal which activates the constant current source 8 to thereby charge the capacitor $C_2$ with the constant current i from the current source 8.

On the other hand when the signal d from the oscillator 6 passes through the zero voltage level going toward negative polarity, the comparator 7 returns to the original state causing the normal phase output C and the reverse phase output to be low and high levels respectively. At this time, the constant current source 8 is deenergized and the constant current source 9 starts to operate so that the capacitor $C_2$ is discharged by the current i from the constant current source 9. Therefore, the carrier signal d' corresponding to the voltage of the capacitor $C_2$ is delayed $\pi/2$ with respect to the carrier signal d from the oscillator 6 as shown in FIG. 4. The peak level of the carrier signal d' can be made coincident with that of the carrier signal d from the oscillator 6 by suitably setting the values of the constant current i from the constant current source 8 or 9 and the capacitance value of the capacitor $C_2$.

By applying the carrier signals d and d' having a phase difference of $\pi/2$ therebetween to the non-inverting terminals of the comparators 2 and 2' of the right and left channels in FIG. 1, respectively, the rectangular pulse signals produced at the outputs of the pulse amplifiers 3 and 3' due to pulse width modulation by the comparators 2 and 2' have the relations shown in FIG. 2c and 2d even when the audio signals a and a' are applied to the audio amplifiers 1 and 1'. Therefore, even if the duty cycles vary, the desired phase relationship is maintained so that no distortion is caused.

In the above described embodiment, the phase difference between the carrier signals d and d' is $\pi/2$. It should be noted, however, that the difference need not always be exactly $\pi/2$. That is, the phase difference can be arbitrary so long as the rise and fall times of the rectangular pulses at the outputs of the comparators 2 an 2' of the two channels are out of phase with the variations of duty cycles due to the modulation.

Thus, according to the present invention, the rise and fall times of the modulated rectangular phase signals of the respective channels are made to be out of phase with one another resulting in the prevention of distortion from interchannel interference. This feature is particularly advantageous for low output power applications.

What is claimed is:

1. A pulse width modulation amplifier for a plurality of channels comprising: first and second channel amplifiers each comprising a pulse width modulation comparator, said first and second channel amplifiers providing separate uncombined output representing different input signals; and means for applying ramp carrier signals having a phase difference therebetween of substantially 90° to respective ones of said pulse width modulation comparators wherein rise and fall times of output rectangular pulses of said comparators occur at different times between said first and second channel amplifiers.

2. The pulse width modulation amplifier of claim 1 wherein said first and second channel amplifiers together comprise a single common oscillator and wherein said means for applying said ramp carrier signals comprises a comparator having a noninverting input terminal coupled to an output of said oscillator, said comparator producing a first output signal having a high level when one of said non-inverting input terminal and an inverting input terminal is at a potential greater than that of the other said terminal and producing a second output signal having a high level when the other of said input terminals is at a higher potential; first and second constant current sources, said first constant current source being coupled to be activated in response to said first output signal from said comparator and said second constant current source being coupled to be activated by said second output signal from said comparator; a first capacitor coupled to be charged by current from said first constant current source and to be discharged by current from said second constant current source; and an integrator circuit coupled between a charging first terminal of said first capacitor and said inverting input terminal of said comparator, said integrator circuit comprising a resistor having a first terminal coupled to said charging terminal of said first capacitor and a second capacitor coupled between a second terminal of said resistor and ground, said first terminal of said second capacitor and said second terminal of said resistor being coupled to said inverting input terminal of said comparator.

3. The pulse width modulation amplifier of claim 1 or 2 wherein said first and second channel amplifiers each comprise a linear audio amplifier, a pulse amplifier having an input coupled to an output of said pulse width modulation comparator with an output of said pulse amplifier being fed back to said inverting input of said comparator, and a low pass filter having an input coupled to an output of said pulse amplifier and an output coupled to a loudspeaker.

* * * * *